(12) United States Patent
Crenshaw et al.

(10) Patent No.: US 6,184,074 B1
(45) Date of Patent: *Feb. 6, 2001

(54) METHOD OF FABRICATION A SELF-ALIGNED POLYSILICON/DIFFUSION BARRIER/OXYGEN STABLE SIDEWALL BOTTOM ELECTRODE STRUCTURE FOR HIGH-K DRAMS

(75) Inventors: Darius Crenshaw, Allen, TX (US); Scott Summerfelt, Cupertino, CA (US)

(73) Assignee: Texas Instruments Incorporated, Dallas, TX (US)

( * ) Notice: Under 35 U.S.C. 154(b), the term of this patent shall be extended for 0 days.

This patent is subject to a terminal disclaimer.

(21) Appl. No.: 09/211,663

(22) Filed: Dec. 15, 1998

Related U.S. Application Data

(60) Provisional application No. 60/069,903, filed on Dec. 17, 1997.

(51) Int. Cl.⁷ .................. H01L 21/8234; H01L 21/8244

(52) U.S. Cl. .............. 438/238; 438/3; 438/239; 438/240

(58) Field of Search ................ 438/3, 238, 239, 438/240, 197, 142

(56) References Cited

U.S. PATENT DOCUMENTS

| | | | |
|---|---|---|---|
| 5,393,352 | 2/1995 | Summerfelt | 148/33.3 |
| 5,471,364 | 11/1995 | Summerfelt et al. | 361/321.4 |
| 5,554,564 | 9/1996 | Nishioka et al. | 437/192 |
| 5,566,045 | 10/1996 | Summerfelt et al. | 361/231.1 |
| 5,585,300 | 12/1996 | Summerfelt | 437/60 |
| 5,589,284 | 12/1996 | Summerfelt et al. | 428/697 |
| 5,972,722 | * 10/1999 | Visokay et al. | 438/3 |
| 5,998,225 | * 12/1999 | Crenshaw et al. | 438/3 |
| 6,033,919 | * 3/2000 | Gnade et al. | 438/3 |

* cited by examiner

*Primary Examiner*—Richard Elms
*Assistant Examiner*—Christian D. Wilson
(74) *Attorney, Agent, or Firm*—Jacqueline J. Garner; W. James Brady, III; Frederick J. Telecky, Jr.

(57) ABSTRACT

The capacitor (12) comprises a HDC dielectric (40) and upper (44) and lower (32–36) electrodes. The lower electrode comprises a polysilicon base (32), a diffusion barrier (34) on the sidewalls of the polysilicon base (32) and an oxygen stable material (36) on the sidewalls adjacent the diffusion barrier (34) and separated from the polysilicon base (32) sidewalls by the diffusion barrier (34). The oxygen stable material (36) is formed on the sidewalls by a deposition and either etchback or CMP process rather than by a patterned etch. The HDC dielectric (40) is then formed adjacent the oxygen stable material (36).

23 Claims, 5 Drawing Sheets

METHOD OF FABRICATION A SELF-ALIGNED POLYSILICON/DIFFUSION BARRIER/OXYGEN STABLE SIDEWALL BOTTOM ELECTRODE STRUCTURE FOR HIGH-K DRAMS

This application claims priority under 35 USC §119 (e)(1) of provisional application No. 60/069,903, filed Dec. 17, 1997.

CROSS-REFERENCE TO RELATED APPLICATIONS

The following co-pending applications are related and are hereby incorporated herein by reference:

| Serial No. | Filed | Inventors |
| --- | --- | --- |
| TI-25532 | | Crenshaw et al |
| TI-25533 | | Crenshaw et al |
| TI-25534 | | Crenshaw et al |

FIELD OF THE INVENTION

This invention generally relates to the fabrication of high dielectric constant capacitors.

BACKGROUND OF THE INVENTION

The increasing density of integrated circuits (e.g., DRAMs) is increasing the need for materials with high dielectric constants to be used in electrical devices such as capacitors. Generally, capacitance is directly related to the surface area of the electrode in contact with the capacitor dielectric, but it is not significantly affected by the electrode volume. The current method generally used to achieve higher capacitance per unit area is to increase the surface area/unit area by increasing the topography in trench and stack capacitors using silicon dioxide or silicon dioxide/silicon nitride as the dielectric. This approach becomes very difficult in terms of manufacturability for devices such as the 256 Mbit and 1 Gbit DRAMs.

An alternative approach is to use a high permitivity dielectric material. Many high dielectric constant (HDC) materials including perovskites, ferroelectrics and others, such as (Ba, Sr)TiO$_3$ (BST), usually have much larger capacitance densities than standard SiO$_2$—Si$_3$N$_4$—SiO$_2$ capacitors. The deposition process for HDC materials such as BST usually occurs at high temperature (generally greater than 500° C. ) in an oxygen containing atmosphere. Therefore, the lower electrode structure formed prior to the HDC deposition should be stable in an oxygen atmosphere and at these temperatures.

Various metals and metallic compounds, and typically noble metals such as Pt and conductive oxides such as RuO$_2$, have been proposed as the electrodes for the HDC materials. However, there are several problems with the materials thus far chosen for the lower electrode in thin-film applications. Many of these problems are related to semiconductor process integration. For example, it has been found to be difficult to use Pt alone as the lower electrode. While Pt is stable in oxygen, it generally allows oxygen to diffuse through it allowing neighboring materials to oxidize. Pt does not normally stick very well to traditional dielectrics such as silicon dioxide and silicon nitride and Pt can rapidly form a silicide at low temperatures. Therefore, prior art methods have used lower electrodes comprising multiple layers to separate the Pt from the underlying silicon. However, even when multiple layers are used for the lower electrode, a problem remains in that Pt is very difficult to etch when using a pattern. The principle problem is the difficulty in forming volatile halides. For example, etching Pt in fluorine and chlorine gas mixtures is almost a completely physical process until very high temperatures (>300° C.) are reached. Physical etching typically results in redeposition on the sidewalls of photoresist or other pattern definers unless a very sloped sidewall (<65 degrees) is used. If the goal is to etch 1G-like structures (F-0.18 μm) with reasonable aspect ratios (>1), then sloped sidewalls are a serious problem.

SUMMARY OF THE INVENTION

A capacitor structure and method of forming the capacitor structure are disclosed herein. The capacitor comprises a HDC dielectric and upper and lower electrodes. The lower electrode comprises polysilicon, a diffusion barrier on the sidewalls of the polysilicon and an oxygen stable material on the sidewalls adjacent the diffusion barrier and separated from the polysilicon sidewalls by the diffusion barrier. The oxygen stable material is formed on the sidewalls by a deposition and either etchback or CMP process rather than by a patterned etch. The HDC dielectric is then formed adjacent the oxygen stable material.

An advantage of the invention is proving a method of forming a high-K capacitor that does not require a fine patterned etch of the oxygen stable material for the lower electrode.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention is described herein in conjunction with a high-K capacitor structure for a DRAM application. It will be apparent to those of ordinary skill in the art that the benefits of the invention are also applicable to other high-K capacitor structures.

Figure 1:
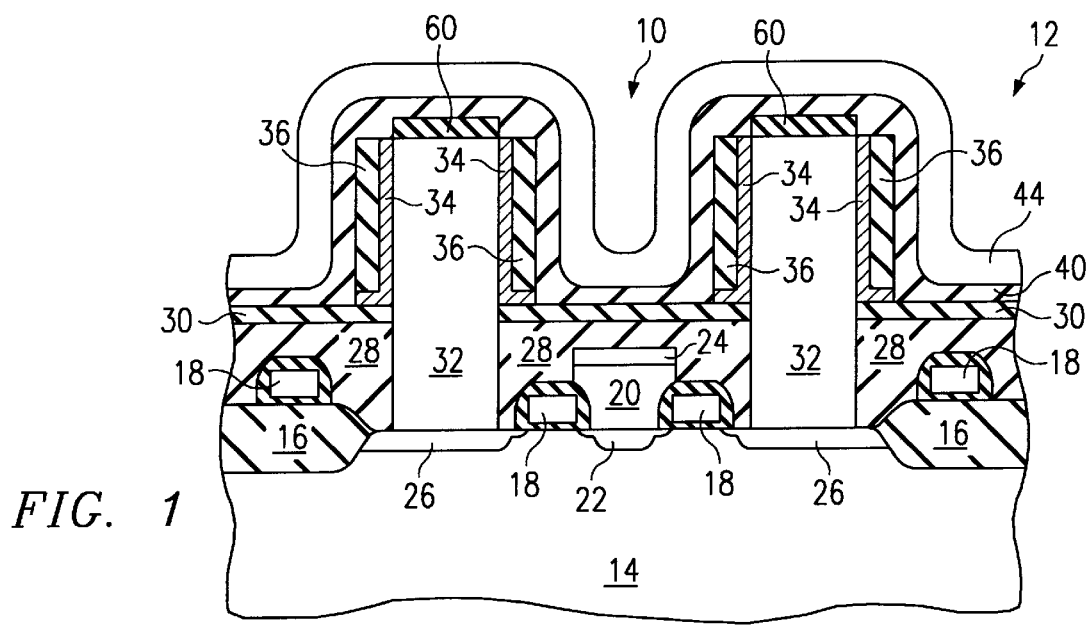
FIG. 1 is a cross-sectional diagram of a DRAM cell pair including a capacitor according to the invention.

A pair of DRAM cells 10 each including a capacitor 12 according to the invention are shown in FIG. 1. The pair of DRAM cells 10 are located on substrate 14. Substrate 14 is typically silicon. However, other semiconductors such as germanium or diamond, compound semiconductors such as GaAs, InP, Si/Ge, or SiC, and ceramics may alternatively be used. Insulating regions 16 are used to isolate the pair of DRAM cells 10 from other DRAM cell pairs (not shown). As shown, insulating regions 16 comprise a field oxide region. Other isolation structures known in the art, such as shallow trench isolation, may alternatively be used. Wordline structures 18 form the gates of the transistor. Wordlines structures 18 may the same as those used conventionally in DRAM structures. Bitline contact 20 is used to connect the common source/drain 22 of the DRAM cell pair 10 to the bitline 24. The opposite source/drain regions 26 are each connected to the bottom electrode of a capacitor 12. The interlevel dielectric 28 is capped by an etchstop layer 30. The interlevel dielectric layer 28 typically comprises an oxide such as silicon dioxide. The etchstop layer 30 comprises a material that may be etched selectively with respect to a temporary dielectric described further below. In the preferred embodiment, etchstop layer 30 comprises silicon nitride. Other materials that provide a non-reactive etchstop and possible diffusion barrier, such as undoped TEOS, aluminum-oxide, titanium-oxide or aluminum-nitride may alternatively be used.

The bottom electrode of capacitors 12 comprises a base 32. Base 32 may form the shape of a plug that extends from source/drain region 26 through interlevel dielectric 28 and etchstop layer 30 to a predefined height above etchstop layer 30. The predefined height is determined by the capacitance level needed for the capacitor 12. For a 1 Gbit DRAM using a BST dielectric, a height in the range of 3000 Å is desirable. Base 32 would typically comprise doped polysilicon, such as insitu-doped polysilicon. Alternatively, base 32 could comprise a conformal TiN layer and a fill TiAlN layer.

On the sidewalls of the portion of base 32 that extends above etchstop layer 30, a diffusion barrier 34 and oxygen stable layer 36 are located. Diffusion barrier 34 preferably comprises titanium-aluminum-nitride. Other materials that prevent the diffusion of oxide and that do not react with the poly base 32, such as titanium-nitride, ternary (or greater) amorphous nitrides (e.g., Ti—Si—N, Ta—Si—N, Ta—B—N, or Ti—B—N), or other exotic conductive nitrides (e.g., Zr nitride, Hf nitride, Y nitride, Sc nitride, La nitride and other rare earth nitrides, nitride deficient Al nitride, doped Al nitride, Mg nitride, Ca nitride, Sr nitride and Ba nitride) may alternatively be used. Oxygen stable layer 36 preferably comprises platinum. Other possible materials include other noble metals or alloys thereof (e.g., palladium, iridium, ruthenium, rhodium, gold, silver), conductive metal compounds (e.g., binary oxides, $RuO_x$, tin oxide, $IrO_x$, indium oxide, etc,), or conductive perovskite like materials (e.g., $(La,Sr)CoO_{3+}$, $SrRuO_3$, etc.).

Diffusion barrier 34 prevents oxygen from diffusing through oxygen stable layer 36 and reacting with/ oxidizing base 32. It also prevents oxygen stable layer 36 from reacting with base 32 to form a silicide. The diffusion barrier might be omitted for some combinations of oxygen stable materials and high-K material process temperature and ambients when oxidation and/or silicidation of the base 32 is not a concern.

The capacitor dielectric 40 is a high dielectric constant dielectric, typically having a dielectric constant greater than 50. Barium-strontium titanate (BST) is a typical example. Other examples include $SrTiO3$, $BaTiO3$, ferroelectric materials such as $Pb(Zr,Ti)O_3$, $(Pb,La)(Zr,Ti)O_3$, Nb doped PZT, doped PZT, $Bi_4Ti_3O_{12}$, $SrBi_2(Ta,Nb)_2O_9$, and other layered perovskites, relaxors such as lead-magnesium-niobate. Dielectric 40 is separated from base 32 by oxygen stable layer 36 and diffusion barrier 34 on the sidewalls of the base. The formation of dielectric 40 is typically performed in an $O_2$ ambient. Oxygen stable layer 36 is stable in $O_2$ and prevents oxidation on the sidewalls of the bottom electrode. This is where most of the capacitance comes from. A significantly smaller portion of the capacitance will come from the top of the base 32 where the dielectric 40 is separated from the base by a relatively thick oxide layer 42. A top electrode 44 is located over the dielectric 40. The top electrode 44 comprises conventional materials.

Figure 2A:
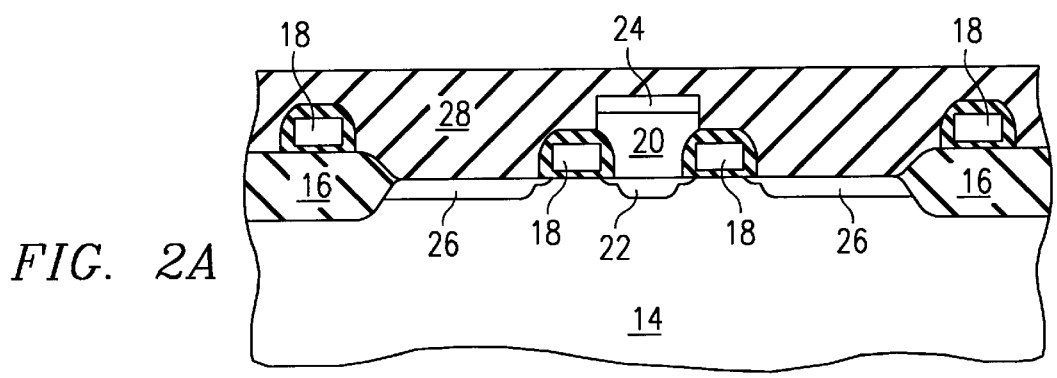
FIGS. 2A–2I are cross-sectional diagrams of the DRAM cell pair of FIG. 1 at various stages of fabrication.

A method for forming the DRAM cell pair 10 of FIG. 1 will now be described in conjunction with FIGS. 2A–2I. The structure is processed through the formation of interlevel dielectric 28 as shown in FIG. 2A. Isolating regions 16, source/drain regions 22 and 26, wordline structures 18, and bitlines 24 have already been formed. Conventional techniques known in the art may be used to formed these structures.

Next, an etchstop layer 30 is formed over interlevel dielectric 28 and a temporary dielectric layer 50 is formed over etchstop layer 30. The material for etchstop layer 30 is chosen so that temporary dielectric layer 50 may be etched selectively with respect to etchstop layer 30. As an example, BPSG may be used for temporary dielectric layer 50 and silicon nitride could be used for etchstop layer 30. Alternative combinations of materials will be apparent to those of ordinary skill in the art. For example, other combinations include BPSG and either undoped TEOS, aluminum-oxide, titanium-oxide or aluminum-nitride; and either undoped TEOS or PSG and silicon nitride. Temporary dielectric 50 should comprise an etchable material that is not reactive with polysilicon which will be deposited in subsequent processing. Etchstop layer 30 should be a non-reactive etchstop relative to the temporary dielectric 50 and possible diffusion barrier.

Figure 2B:
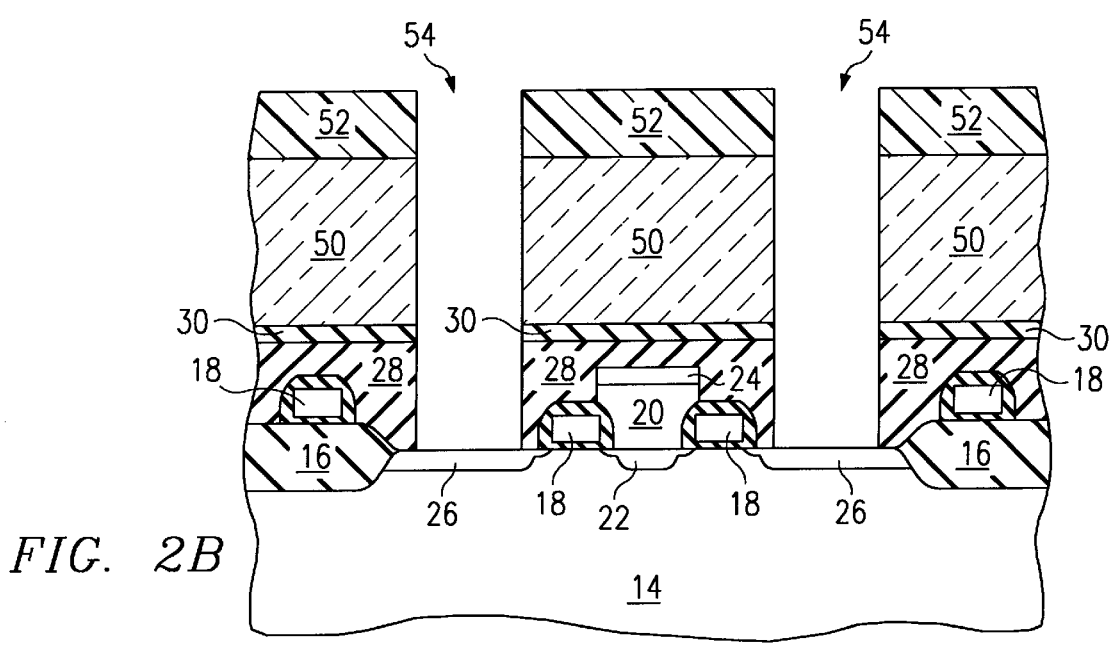

At this point, a storage node contact (SNCT) pattern 52 is formed over temporary dielectric 50. SNCT pattern 52 is used to expose portions of temporary dielectric 52 where moat contact areas 54 are desired and cover the remaining portions of temporary dielectric 52. SNCT pattern 52 would typically comprises a resist material. The structure is then etched as shown in FIG. 2B using SNCT pattern 52. As shown in FIG. 2B, temporary dielectric 50, etchstop layer 30 and interlevel dielectric 28 are all etched down to source/drain region 26. This etch requires excellent selectivity to material on top of the bitline 20 and wordline 18. This material is typically $Si_3N_4$. The bitline 20 stack needs to be designed so that the capacitor etch will not etch through the dielectric materials on top of the bitline 20. In addition, low dielectric constant materials are desirable to minimize parasitic bitline to capacitor or bitline to bitline capacitance.

Figure 3:
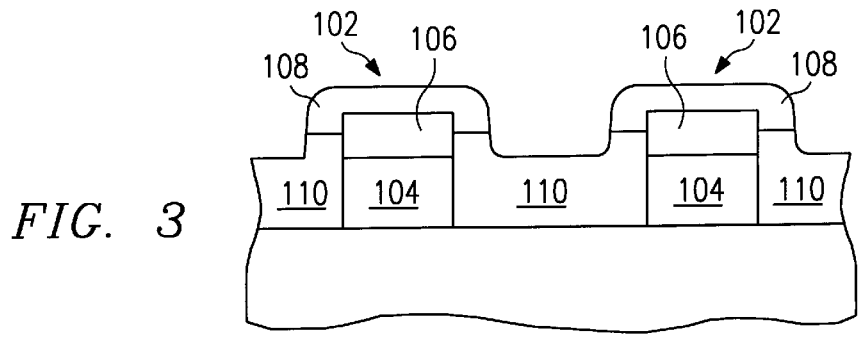
FIG. 3 is a cross-sectional diagram of a bitline or wordline structure for use with the invention.

It is possible to use the structure shown in FIG. 3 for either a bitline or wordline or both. The bitline or wordlines structure 102 comprises a metal layer 104, a low dielectric constant layer 106 and an etchstop layer 108. A low dielectric constant layer 110 is located adjacent the structure 102. The metal layer 104 can comprise a typical metal used for bitlines or wordlines such as tungsten and/or titanium-nitride. Low dielectric constant layer 106 comprises a low dielectric constant material such as one that is $SiO_2$ based (maybe F doped $SiO_2$) or HSG, etc. Etchstop layer 108 may comprise, for example, $Al_2O_3$, AlN, or $Si_3N_4$. Low dielectric constant layer 110 may also be $SiO_2$ based.

Figure 4A:
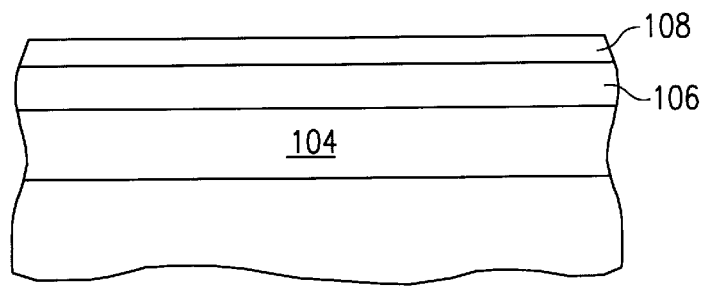
FIGS. 4A–4D are cross-sectional diagrams of the structure of FIG. 3 at various stages of fabrication.
Figure 4B:
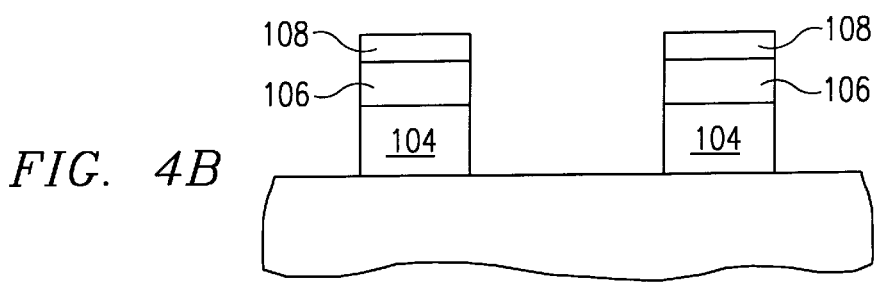
Figure 4C:
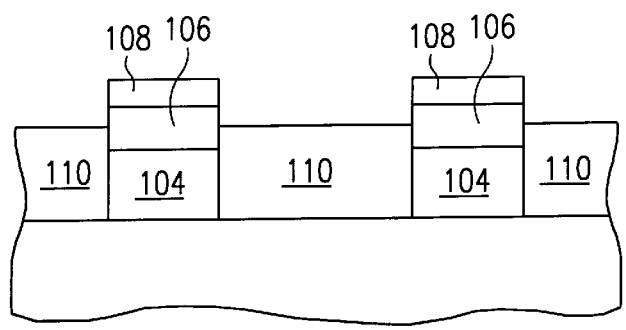
Figure 4D:
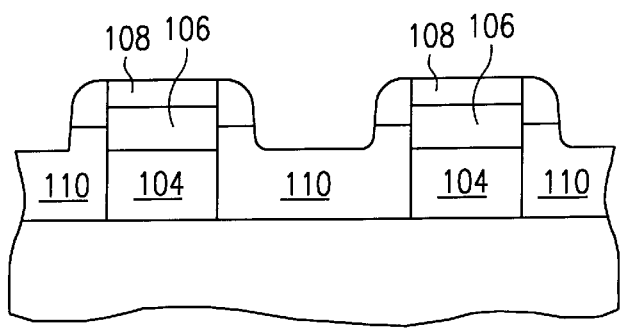

A process for forming the bitline or wordline structure 102 of FIG. 3 will now be discussed with reference to FIGS. 4A–4D. Referring to FIG. 4A, metal layer 104 is deposited followed by low dielectric constant layer 106 and then etchstop layer 108. If $Al_2O_3$ is to be used as the etchstop layer, either Al or $Al_2O_3$ may be deposited at this point. Referring to FIG. 4B, layers 104–108 are then etched. The etch of layer 104 may be a resist patterned etch. Then, layer 104 may be used as a hardmask for the etch of layers 106 and 108. Referring to FIG. 4C, a planarizing low K material 110 is deposited. For example, HDP $SiO_2$ may be used. Either a HDP deposition or a deposition-planarization(optional)-etchback process may be used. The goal is to form the structure shown in FIG. 4C with layer 110 recessed below the stack of layers 104–108 but also as high as possible by optimizing the thicknesses of layers 108, 106 and the recess depth. Finally, as shown in FIG. 4D, a conformal deposition and etchback of additional etchstop material for layer 108 is performed. If Al was originally deposited for layer 108, $Al_2O_3$ is now deposited. Oxidation can be plasma enhanced, water enhanced, or both. For example, boil $H_2O$, followed by a 650° C. $O_2$ for 10 min. or steam oxidation at 650° C. for 10 min. The anneal can be optimized. Notice that upon processing, after etch, there is a continuous low-k layer around the metal layer 104 minimizing parasitic capacitance.

It should be noted that in some capacitor-over-bitline (COB) architectures, a self-aligned contact (SACT) has previously been filled with a polysilicon base to form a pad landing (not shown) at bitline height. (The SACT is formed during the bitline contact 20 formation.) In this case, the SNCT pattern 52 is aligned to this pad and the above described etch stops at this pad.

Figure 2C:
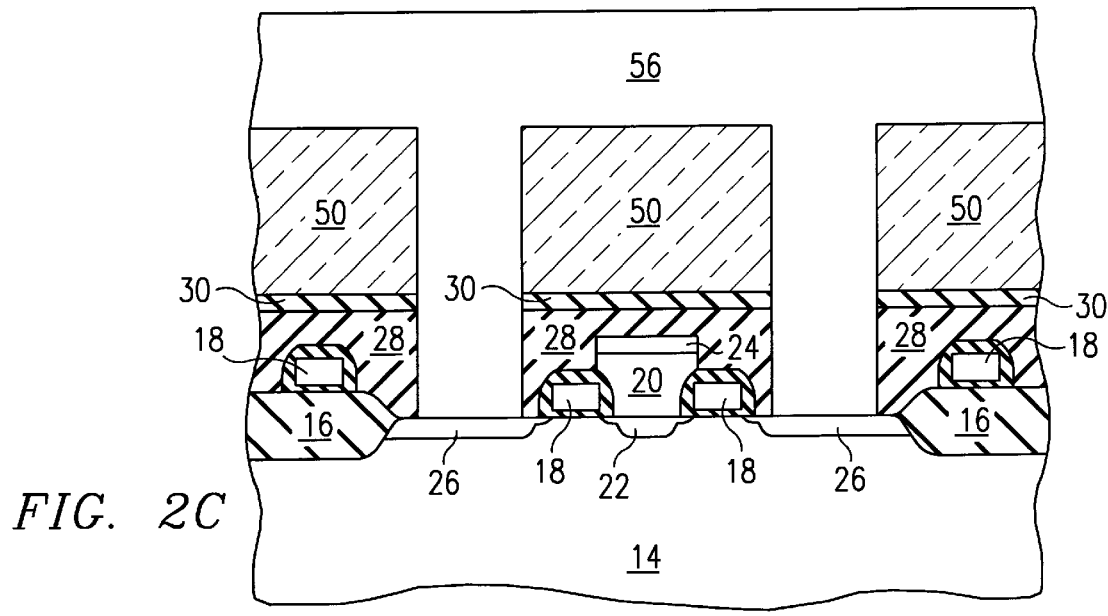

Referring to FIG. 2C, the SNCT pattern 52 is removed and the base material 56 is deposited over the structure filling moat contact areas 54. Preferably, base material 56 comprises insitu doped (ISD) polysilicon. However, base material 56 may alternatively comprise metal compounds (such as nitrides, silicides, or carbides), conductive metals (such as titanium, tungsten, tantalum, or molybdenum), single component semiconductors (such as silicon or germanium), compound semiconductors (such as GaAs, InP, Si/Ge, or SiC), or combinations of the above. Due to the high conformality of the base material 56 when ISD polysilicon is used, it should nearly planarize over the moat contact areas 54.

Figure 2D:
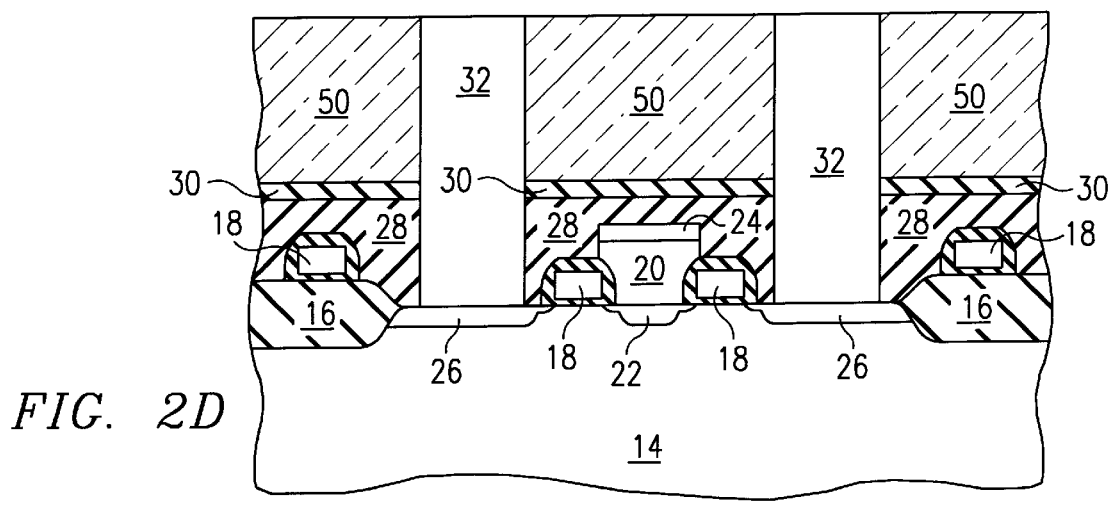
Figure 2E:
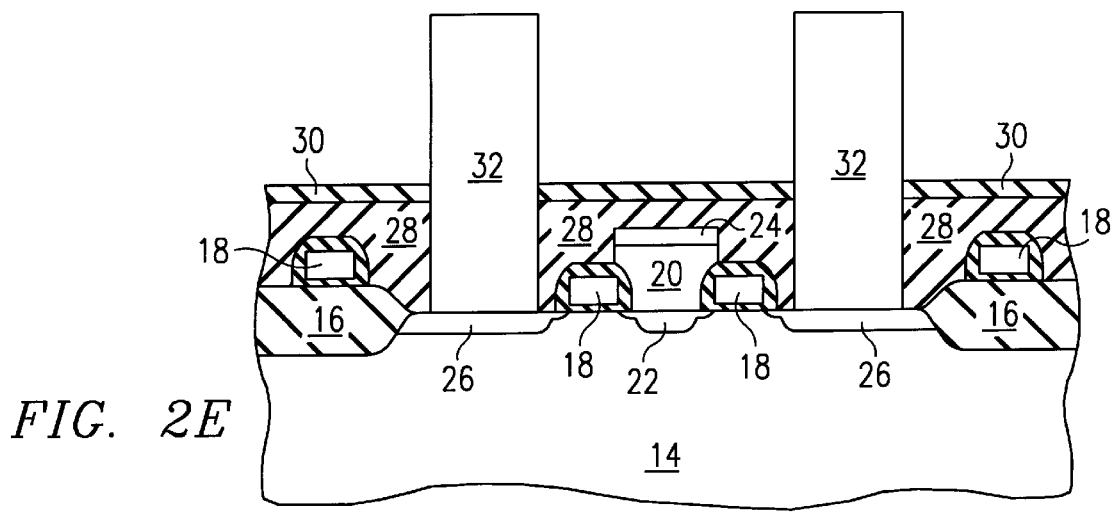

Referring to FIG. 2D, the base material 56 is then partially removed so that it is planarized with the surface of the temporary dielectric layer 50 to form bases 32. This may be accomplished using an etchback process that promotes the highly selective etching of the base material 56 relative to the material of the temporary dielectric 50. Alternatively, chemical-mechanical polishing may be used. Then, a etch process of the opposite selectivity that promotes the highly selective etching of the temporary dielectric 50 relative to the base 32 and etchstop layer 30 is used to remove the temporary dielectric 50 as shown in FIG. 2E. The etch stops on etchstop layer 30.

Figure 2F:
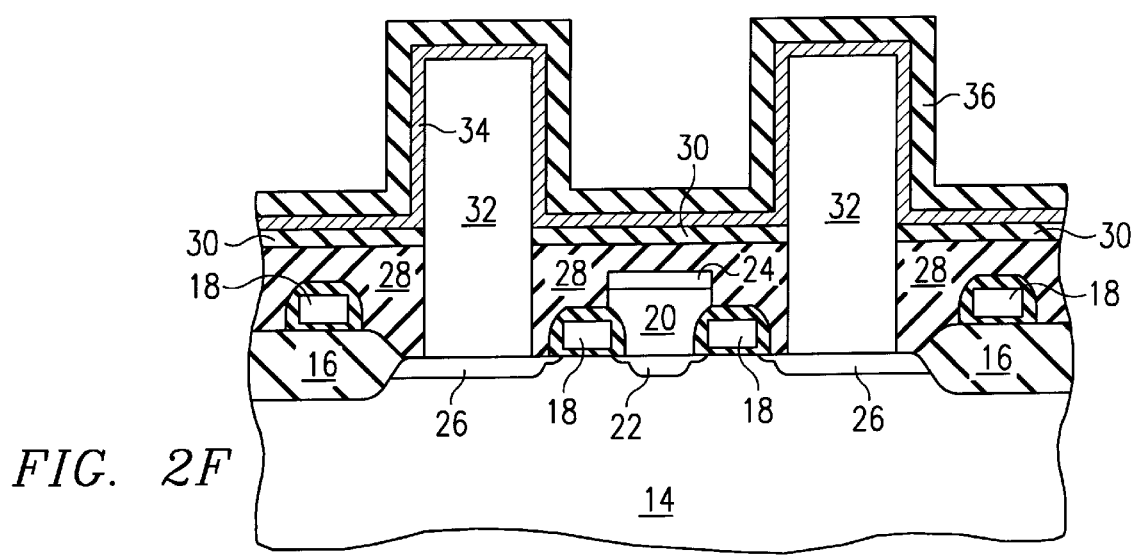

The next step in the formation of the bottom electrode/ storage node is the deposition of the diffusion barrier 34 followed by the deposition of the oxygen stable layer 36 as shown in FIG. 2F. Although titanium-nitride is a popular diffusion barrier, a material such as Ti—Al—N is preferable because of its superior oxidation resistance. The optimum TiAlN compositions are $Ti_{1-x}Al_xN$, where $0.3<x<0.5$. Other materials that may be used for diffusion barrier 34 include, but are not limited to, ternary (or greater) amorphous nitrides and exotic conductive nitrides as listed in more detail above. Pt is an excellent oxygen stable material 36. Other examples for substrate is placed in a Electron Cyclotron Resonance (ECR) high density plasma reactor. The Pt is etched using a large bias voltage with a gas chemistry of $Cl_2/O_2$, $Ar/O_2$ or $Cl_2/Ar/O_2$ supplied at moderate flow rate (i.e., on the order of 30 sccm). Adding $O_2$ enhances the selectivity between the TiAlN and Pt. A large ECR power and RF bias power (e.g., 1500 and 900 Watts respectively) are used. The pressure may be on the order of 2 mTorr. Once the Pt has cleared from the bottom, the etch is modified to optimize the selectivity between TiAlN and $SiO_2$. This is easily accomplished using the above chemistry and removing the $O_2$, reducing the bias voltage, and increasing the pressure. It may also be beneficial to reduce the amount of Ar. The pressure may be increased to on the order of 5 mTorr, while the RF bias power is decreased to on the order of 300 Watts.

An alternative for reducing the redeposition of Ti and/or Al on the Pt sidewalls, is to etch the diffusion barrier 34 after the diffusion barrier 34 deposition and before the oxygen stable layer 36 deposition. Then, the oxygen stable layer 36 is deposited and etched. An additional benefit to this approach is that the diffusion barrier at the bottom of the base 32 is not exposed to the ambient as it is in the original sequence. It is covered by the oxygen stable layer 36, so there is only a concern of an exposed diffusion barrier edge at the top of the structure.

The invention has several benefits. The first benefit is that the oxygen stable bottom electrode is defined by etching the easily etchable material of the temporary dielectric 50 (e.g. BPSG) and not by etching the oxygen stable material 36. With the exception of Ru, most of the oxygen stable bottom electrode materials are very hard to dry etch fine patterns. The principle problem is the difficulty in forming volatile halides or oxides. For example, etching Pt in fluorine and chlorine gas mixtures is almost a completely physical process until very high temperatures (>300° C.) are reached. Physical etching typically results in redeposition on the sidewalls of photoresist or other pattern definers unless a very sloped sidewall (<65 degrees) is used. If the goal is to etch 1G-like structures (F-0.18 $\mu$m) with reasonable aspect ratios (>1), then sloped sidewalls are a serious problem. Etching the oxygen stable material (Pt) from a sidewall structure is much easier because there are no pattern defining masks from which redeposition can occur resulting in undesirable "ears". The redeposition of Pt on the sidewalls is actually advantageous if the properties on redeposited Pt are similar to that for as deposited Pt.

Another benefit of the process is that it minimizes the amount of oxygen stable material present in the final device as well as the need for deposition. Most of the oxygen stable materials are noble metals and material cost for them is significant. If a traditional approach is used and the capacitor needs to be 3000 Å tall, then 3000 Å of an oxygen stable material would need to be deposited. Using the invention's sidewall approach, the oxygen stable material thickness is relatively independent of capacitor height. Therefore, if approximately 500 Å of oxygen stable material is needed, only about 500 Å of oxygen stable material needs to be deposited even if the capacitor height is 3000 Å. In addition, a known problem of Pt in particular is that it has a radioactive isotope which upon decay emits a high energy alpha particle. The Pt sidewall structure significantly reduces the amount of Pt that would otherwise be required.

Figure 2G:
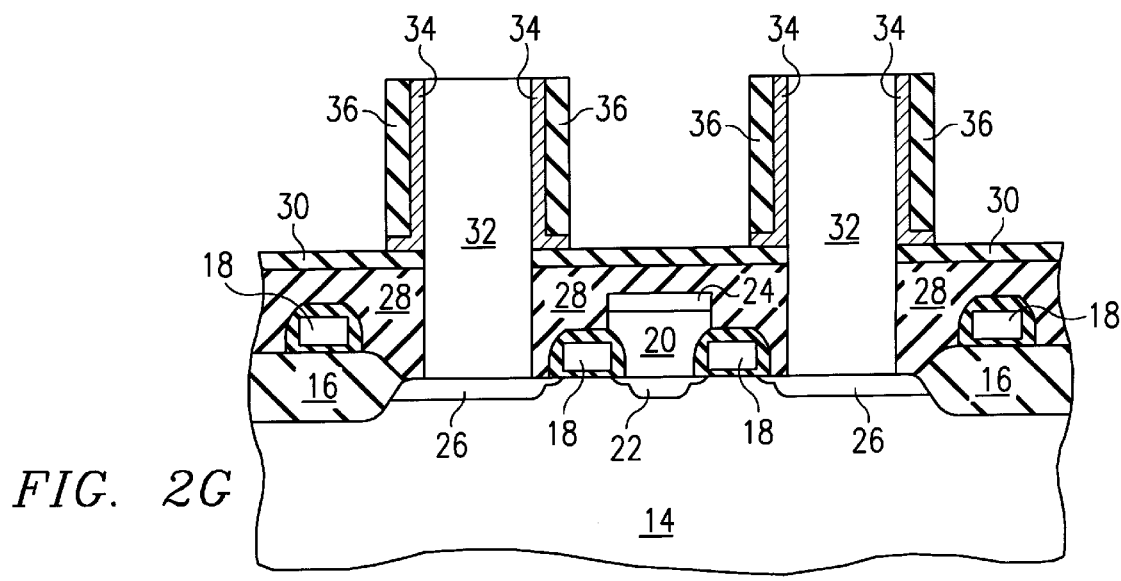
Figure 2H:
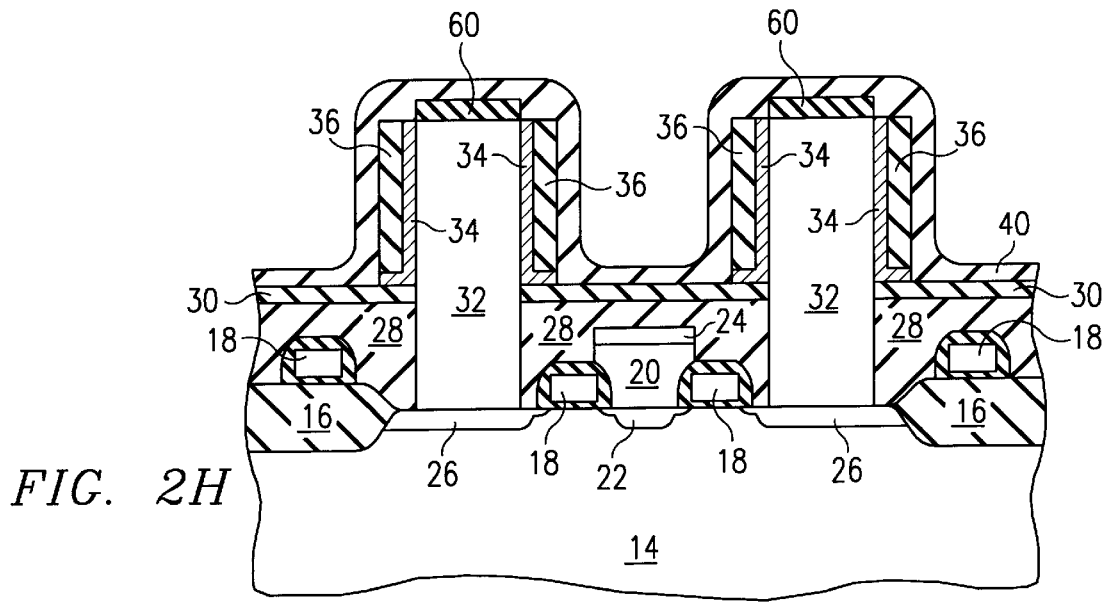
Figure 2I:
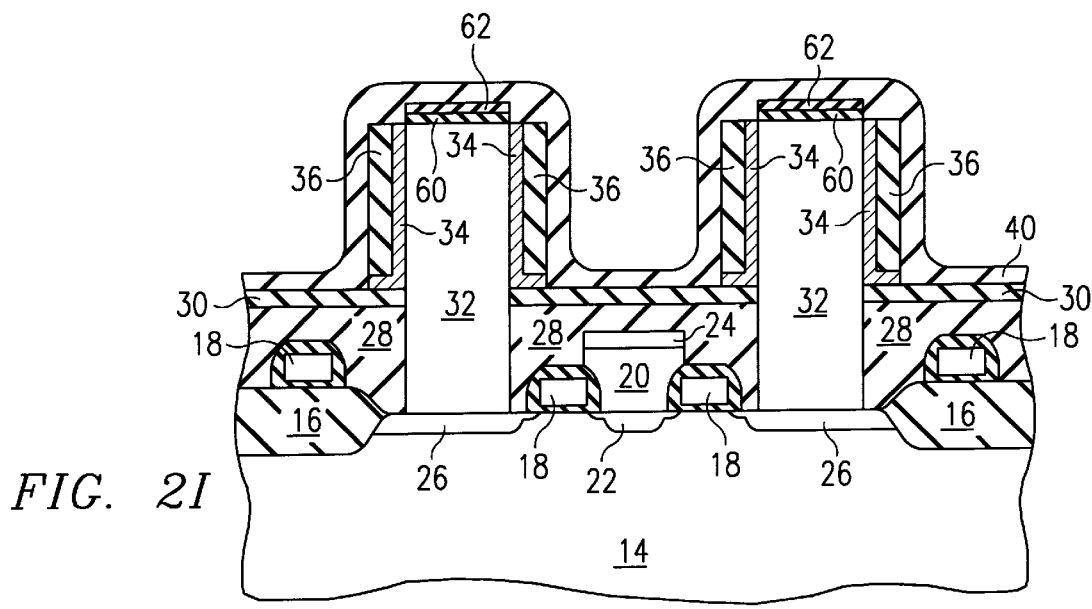

The structure of FIG. 2G is the storage node upon which the HDC capacitor dielectric is deposited, as shown in FIG. 2H. The preferred HDC dielectric is BST. However, other HDC dielectric could alternatively be used. For BST in particular, because a segment of the BST formation process is done in an $O_2$ ambient, the exposed tops of the base 32 oxidize forming layer 60. Therefore a low-K contribution or the total capacitance will come from the tops of the storage node. For this reason, the height of the base 32 should be large enough to obtain the sidewall area which will translate into the required cell capacitance level. At 1 Gb dimensions, the sidewalls are projected to be the dominant area contributor to capacitance regardless of the storage-node architecture for any cell featuring ferroelectrics. A possible means of increasing the top contribution to capacitance is to perform a rapid-thermal nitridation (RTN) process on the bottom electrode prior to the HDC dielectric deposition, as shown in FIG. 2I. This process increases the oxidation resistance of the exposed base 32 while not adversely affecting the outer Pt surface. As a result, a thinner oxide layer 60 is formed under a nitride passivation layer 62.

During BST deposition or post anneal, oxidation of the diffusion barrier and/or silicon might occur. It might than be beneficial to anneal the wafer prior to BST deposition to perform one or more features. The initial oxidation rate of the diffusion barrier or silicon is always much faster initially than later.

Finally, the top capacitor electrode 44 is formed over HDC dielectric 40. Exemplary top electrode materials for use over a HDC dielectric are known in the art. The top electrode 44 will, in general, comprises the same material(s) as the bottom electrode in order to have symmetrical leakage currents. The material in contact with the capacitor dielectric 40 can be relatively thin if it is covered by a conductive diffusion barrier or other metallization layer. A specific embodiment might comprises a 50 nm thick Pt or Ir layer. The deposition is either sputter deposited (long throw, collimated, or ionized for better conformality) or CVD. Next, a 50–100 nm thick layer of TiN or TiAlN is deposited by reactive sputter deposition or by CVD. The top electrode 44 is then pattern by reactive ion etch process and TiN or TiAlN can be used as a hardmask for the remaining etch if desired. The sample might be annealed in $N_2$ is TiN is used of $O_2$ is TiAlN is used as a hardmask. Typical anneal conditions are 650° C. in $N_2$ or $O_2$ for 30 sec for 550° C. in $N_2$ or $O_2$ for 30 min.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a high dielectric constant (HDC) capacitor comprising the steps of:
    forming a temporary dielectric layer over a structure for which the capacitor is desired;
    forming a pattern over the temporary dielectric layer, said pattern exposing portions of the temporary dielectric layer over a storage node area where a bottom electrode of the capacitor is desired;
    etching said temporary dielectric layer using said pattern to remove said temporary dielectric layer in said storage node area;
    removing said pattern;
    forming a conductive base in said storage node area;
    removing said temporary dielectric layer;
    forming a diffusion barrier on the sidewalls of said conductive base;
    forming an oxygen stable layer on the sidewalls of said diffusion barrier, wherein said diffusion barrier prevents said oxygen stable layer from reacting with said conductive base and prevents said conductive base from oxidizing;
    forming a HDC dielectric over the conductive base and oxygen stable layer; and
    forming an upper electrode over the HDC dielectric.

2. The method of claim 1, wherein the step of forming a diffusion barrier comprises the steps of:
    depositing a diffusion barrier material; and
    etching said diffusion barrier material to remove said diffusion barrier material from horizonal surfaces.

3. The method of claim 1, wherein the step of forming an oxygen stable layer comprises the steps of:
    depositing an oxygen stable material over the diffusion barrier; and
    etching said oxygen stable material to remove said oxygen stable material from horizonal surfaces.

4. The method of claim 1, wherein the steps of forming a diffusion barrier and forming an oxygen stable layer comprise the steps of:
    depositing a diffusion barrier material;
    depositing an oxygen stable material over the diffusion barrier material;
    etching the oxygen stable material to remove the oxygen stable material from horizonal surfaces; and
    etching said diffusion barrier material to remove said diffusion barrier material from horizonal surfaces.

5. The method of claim 1, wherein the step of forming said conductive base comprises the steps of:
    depositing a conductive material; and
    etching said conductive material back until said conductive material is substantially co-planar with a surface of said temporary dielectric layer.

6. The method of claim 1, wherein the step of forming said conductive base comprises the steps of:
    depositing a conductive material; and
    chemically-mechanically polishing said conductive material until said conductive material is substantially co-planar with a surface of said temporary dielectric layer.

7. The method of claim 1, further comprising the step of annealing the conductive base prior to the step of forming said HDC dielectric.

8. The method of claim 1, further comprising the step of performing a rapid thermal nitridation of the conductive base prior to said step of forming said HDC dielectric.

9. The method of claim 1, wherein said diffusion barrier comprises a material selected from the group consisting of titanium-nitride, ternary or greater amorphous nitrides, and exotic compound nitrides.

10. The method of claim 1, wherein the oxygen stable layer comprises a material selected from the group consisting of noble metals, alloys of noble metals, and conductive oxides.

11. The method of claim 1, wherein said HDC dielectric comprises a material selected from the group consisting of BST, other perovskites, ferroelectrics, pyroelectrics, or high dielectric constant oxides.

12. A method for forming a DRAM comprising the steps of:
    providing a semiconductor body processed through inter-level dielectric formation, including the formation of isolation structures, wordlines, bitlines contacts, and bitlines;
    depositing an etchstop layer over said interlevel dielectric;
    forming a temporary dielectric layer over said etchstop layer;
    forming a pattern over the temporary dielectric layer, said pattern exposing portions of the temporary dielectric layer over a plurality of storage node areas;
    etching said temporary dielectric layer and said etchstop layer using said pattern to remove said temporary dielectric layer and etchstop layer in said storage node areas;

removing said pattern;

forming a conductive base in each of said storage node areas;

removing said temporary dielectric layer;

forming a diffusion barrier on the sidewalls of said conductive bases;

forming an oxygen stable layer on the sidewalls of said diffusion barrier, wherein said diffusion barrier prevents said oxygen stable layer from reacting with said conductive bases and prevents said conductive bases from oxidizing;

forming a HDC dielectric over the conductive bases and oxygen stable layer; and forming an upper electrode over the HDC dielectric.

13. The method of claim 12, wherein the step of providing a semiconductor body comprises the steps of:

forming isolation structures in a semiconductor body to isolate a plurality of DRAM cell pairs from one another;

forming a plurality of wordline structures over said semiconductor body;

forming a plurality of first and a plurality second source/drain regions on opposite sides of said plurality of wordline structures;

forming an interlevel dielectric over said wordlines, isolation structures and first and second source/drain regions;

forming a plurality of bitline contacts connected to said plurality of first source/drain regions; and forming a plurality of bitlines connected to said bitline contacts.

14. The method of claim 12, wherein the step of forming a diffusion barrier comprises the steps of:

depositing a diffusion barrier material; and etching said diffusion barrier material to remove said diffusion barrier material from horizonal surfaces.

15. The method of claim 12, wherein the step of forming an oxygen stable layer comprises the steps of:

depositing an oxygen stable material over the diffusion barrier; and etching said oxygen stable material to remove said oxygen stable material from horizonal surfaces.

16. The method of claim 12, wherein the steps of forming a diffusion barrier and forming an oxygen stable layer comprise the steps of:

depositing a diffusion barrier material;

depositing an oxygen stable material over the diffusion barrier material;

etching the oxygen stable material to remove the oxygen stable material from horizonal surfaces; and etching said diffusion barrier material to remove said diffusion barrier material from horizonal surfaces.

17. The method of claim 12, wherein the step of forming said conductive base comprises the steps of:

depositing a conductive material; and etching said conductive material back until said conductive material is substantially co-planar with a surface of said temporary dielectric layer.

18. The method of claim 12, wherein the step of forming said conductive base comprises the steps of:

depositing a conductive material; and chemically-mechanically polishing said conductive material until said conductive material is substantially co-planar with a surface of said temporary dielectric layer.

19. The method of claim 12, further comprising the step of annealing the conductive base prior to the step of forming said HDC dielectric.

20. The method of claim 12, further comprising the step of performing a rapid thermal nitridation of the conductive base prior to said step of forming said HDC dielectric.

21. The method of claim 12, wherein said diffusion barrier comprises a material selected from the group consisting of titanium-nitride, ternary or greater amorphous nitrides, and exotic compound nitrides.

22. The method of claim 12, wherein the oxygen stable layer comprises a material selected from the group consisting of noble metals, alloys of noble metals, and conductive oxides.

23. The method of claim 12, wherein said HDC dielectric comprises a material selected from the group consisting of BST, other perovskites, ferroelectrics, pyroelectrics, or high dielectric constant oxides.

* * * * *